(12) United States Patent
Mitkova et al.

(10) Patent No.: US 8,466,425 B2
(45) Date of Patent: Jun. 18, 2013

(54) CHALCOGENIDE GLASS IONIZING RADIATION SENSOR

(75) Inventors: Maria Mitkova, Boise, ID (US); Darryl P. Butt, Boise, ID (US)

(73) Assignee: Boise State University, Boise, ID (US)

( * ) Notice: Subject to any disclaimer, the term of this patent is extended or adjusted under 35 U.S.C. 154(b) by 0 days.

(21) Appl. No.: 13/249,106

(22) Filed: Sep. 29, 2011

(65) Prior Publication Data

US 2013/0082185 A1 Apr. 4, 2013

(51) Int. Cl.
*G01T 1/26* (2006.01)
*H01L 31/08* (2006.01)

(52) U.S. Cl.
USPC .............................. 250/371; 338/15; 338/18

(58) Field of Classification Search
USPC ...................... 250/371, 330, 338.1
See application file for complete search history.

(56) References Cited

U.S. PATENT DOCUMENTS

| | | | | |
|---|---|---|---|---|
| 3,655,255 A | * | 4/1972 | Krause et al. | 359/350 |
| 3,781,748 A | * | 12/1973 | Bishop et al. | 338/15 |
| 6,633,771 B1 | * | 10/2003 | Braig et al. | 600/310 |

* cited by examiner

*Primary Examiner* — David Porta
*Assistant Examiner* — Faye Boosalis
(74) *Attorney, Agent, or Firm* — Parsons Behle & Latimer

(57) ABSTRACT

A chalcogenide glass radiation sensor comprising a chalcogenide glass layer coupled to at least two electrodes and a metal source, and a method using the same are disclosed. The chalcogenide glass layer has a resistivity and the at least two electrodes are configured to facilitate the measurement of the resistivity of the chalcogenide glass layer. The coupling of the metal source and the chalcogenide glass layer is such that the resistivity of the chalcogenide glass layer changes upon exposure to ionizing radiation. The metal source is configured to be external to an electric field that may form between the at least two electrodes as the resistivity of the chalcogenide glass layer is measured.

20 Claims, 4 Drawing Sheets

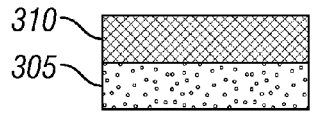
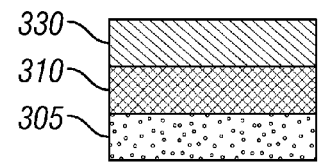
*FIG. 3A*  *FIG. 3B*
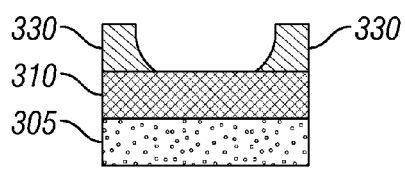
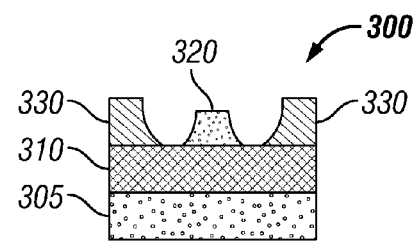
*FIG. 3C*  *FIG. 3D*
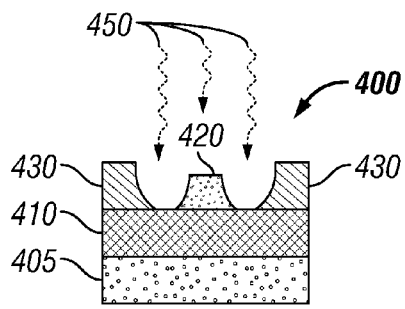
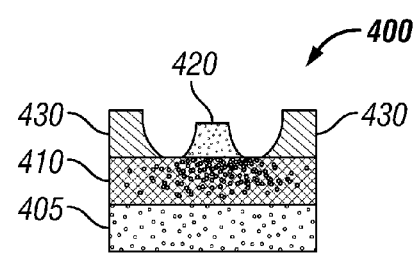
*FIG. 4A*  *FIG. 4B*

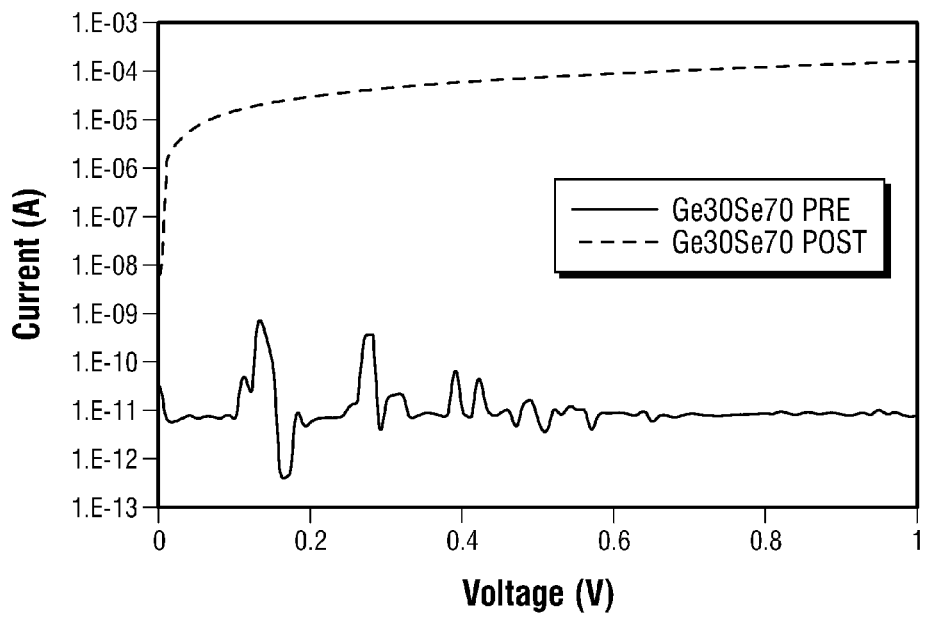
FIG. 7
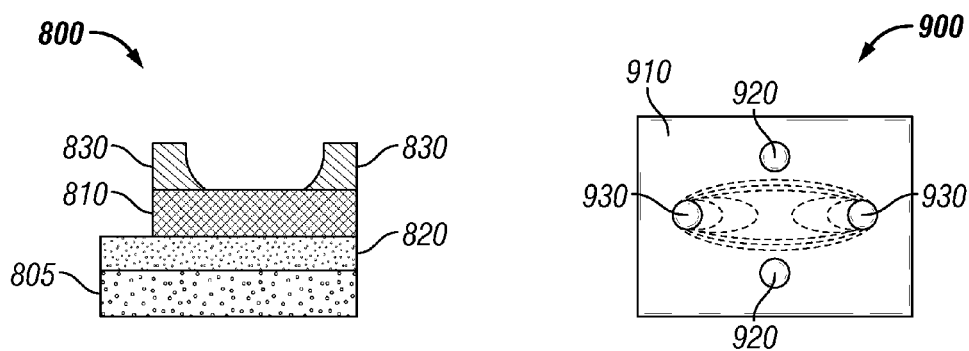
FIG. 8  FIG. 9

CHALCOGENIDE GLASS IONIZING RADIATION SENSOR

BACKGROUND

The present application relates generally to the field of ionizing radiation dosimeters and more specifically to radiation dosimeters that comprise a chalcogenide glass layer configured to interact with metal atoms.

A radiation dosimeter is an instrument for measuring the dose of radiation absorbed by a matter or the intensity of a source of radiation, usually measured over a period of time. Dosimeters are used in proximity to nuclear power sources, such as sea- or land-based nuclear reactors, in proximity to reactive elements in labs or in proximity to nuclear waste, and used by astronauts, among other things.

One of the more prevalent types of radiation dosimeters are film badge dosimeters. Film badge dosimeters are usually made of two parts: a reactive or photographic film and a film holder. The film is removable and may be developed in order to measure exposure. The film is sensitive to radiation and once developed, the areas of the film that have been exposed to radiation exhibit an increased optical density. Additionally, a badge may contain several films of different sensitivities or a single film with multiple coatings, in order to measure a wider range of exposure levels than in the single film/single coating implementation. However, film badge dosimeters have several disadvantages. Perhaps the most significant disadvantage is that they are not useful as a clear real-time indicator of radiation exposure.

Another form of dosimeter is the quartz fiber dosimeter. The quartz fiber dosimeter operates by measuring the decrease in electrostatic charge on a metal conductor in an ionization chamber due to ionization of air in the chamber caused by exposure to ionizing radiation. As opposed to the film badge dosimeters, the radiation doses can be read almost immediately. However, quartz fiber dosimeters are characterized by low accuracy and a small dynamic range.

Thermoluminescent dosimeters sense ionizing radiation as a function of the amount of visible light emitted by a crystal in the detector. The amount of light emitted is related to the amount of radiation exposure. Common thermoluminescent materials include calcium fluoride and lithium fluoride, among others. In operation, ionizing radiation causes electrons to jump to higher energy states where they are trapped due to intentional impurities in the crystal. When heated, the electrons drop back down to their ground state, and they release a photon of energy that equals the difference between the higher trapped energy state and the ground state. While thermoluminescent dosimeters are quite accurate and have the ability to detect a reasonably large dose of absorbed radiation (approximately 5 Gy), they also require relatively high temperature exposures, which can vary from 800-1000K, to return the crystals to their initial state. Therefore, supporting structures, circuitry, and systems usually should be rather robust. Additionally, thermoluminescent dosimeters consume comparatively large amounts of energy.

Solid state dosimeters, such as the GaTe sensor disclosed in U.S. Pat. No. 7,550,735 to Payne et al., measure exposure to ionizing radiation as a change in the electrical properties of an element. Solid state dosimeters are reasonably accurate, but they require a relatively constant power source in order to measure changes in the electrical properties of the exposed material.

SUMMARY

There is a need for an ionizing radiation sensor configured to provide real-time results. There is also a need for a reversible ionizing radiation sensor.

According to one embodiment, a chalcogenide glass radiation sensor includes a chalcogenide glass layer coupled to at least two electrodes and a metal source. The chalcogenide glass layer has a resistivity and the at least two electrodes are configured to facilitate the measurement of the resistivity of the chalcogenide glass layer. The coupling of the chalcogenide glass layer and the metal source is such that the resistivity of the chalcogenide glass layer changes upon exposure to ionizing radiation. The metal source is positioned external to an electric field that may form between the at least two electrodes as the resistivity of the chalcogenide glass layer is measured.

According to one embodiment, a method of measuring ionizing radiation with a chalcogenide glass radiation sensor comprising a metal source coupled to a chalcogenide glass layer, the chalcogenide glass layer having a resistivity that changes as a function of exposure to ionizing radiation comprises exposing the chalcogenide glass radiation sensor to ionizing radiation and measuring the resistivity of the chalcogenide glass layer. Exposing the chalcogenide glass radiation sensor to ionizing radiation thereby causes diffusion of atoms from the metal source into the chalcogenide glass layer. Measuring the resistivity of the chalcogenide glass layer comprises determining the intensity of radiation to which the chalcogenide glass radiation sensor is exposed.

According to one embodiment, a chalcogenide glass radiation sensor comprises a chalcogenide glass radiation sensing module coupled to a measurement module and a display module. The chalcogenide glass radiation sensing module includes a chalcogenide glass layer having a resistivity and coupled to at least two electrodes and a metal source. The at least two electrodes are configured to facilitate the measurement of the resistivity of the chalcogenide glass layer, and the coupling of the chalcogenide glass layer and the metal source is such that the resistivity of the chalcogenide glass layer changes upon exposure to ionizing radiation. The metal source is also positioned external to an electric field that may form between the at least two electrodes as the resistivity of the chalcogenide glass layer is measured. The measurement module is configured to measure the resistivity of the chalcogenide glass layer, and the display module is configured to display a measured resistivity.

These and other embodiments of the present application will be discussed more fully in the detailed description. The features, functions, and advantages can be achieved independently in various embodiments of the present application, or may be combined in yet other embodiments.

BRIEF DESCRIPTION OF THE DRAWINGS

FIGS. 3A-3D are profile views of one embodiment of a chalcogenide glass-metal radiation sensor at various stages of one possible fabrication process.

FIGS. 4A and 4B are profile views of one embodiment of a chalcogenide glass-metal radiation sensor.

FIG. 7 is a graph that shows an exemplary I-V characteristic for a ChG layer before and after irradiating with 200 krad of gamma rays.

FIG. 8 is a profile view of one embodiment of a chalcogenide glass-metal radiation sensor.

FIG. 9 illustrates a chalcogenide glass-metal radiation sensor and an exemplary electric field associated with detecting the resistivity of the radiation sensor.

Like reference numbers and designations in the various drawings indicate like elements.

DETAILED DESCRIPTION

In the following detailed description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that various changes may be made without departing from the spirit and scope of the present invention. The following detailed description is, therefore, not to be taken in a limiting sense.

A chalcogenide glass ("ChG" or "glass") is an alloy of one or more element from group 14. and/or 15 and one or more element from group 16 (e.g., S, Se, and Te). For the purposes of the current disclosure, Ge—Se and Ge—S glasses may be referred to in the examples discussed hereinafter. However, one skilled in the art will readily recognize that there are any number of possible chalcogenide glasses that could be configured according to the current disclosure, including chalcogenide glasses comprising pure or doped antimony (Sb). ChG devices have a comparatively low temperature (<500K) of radiation-induced optical change erasing and are sensitive to relatively higher ionizing radiation doses (to more than 10 MGy) when compared to conventional devices. Also, ChG layers can be coupled with different materials to alter the characteristics that the ChG exhibits, for instance, altering the sensitivity to radiation doses.

Figure 1:
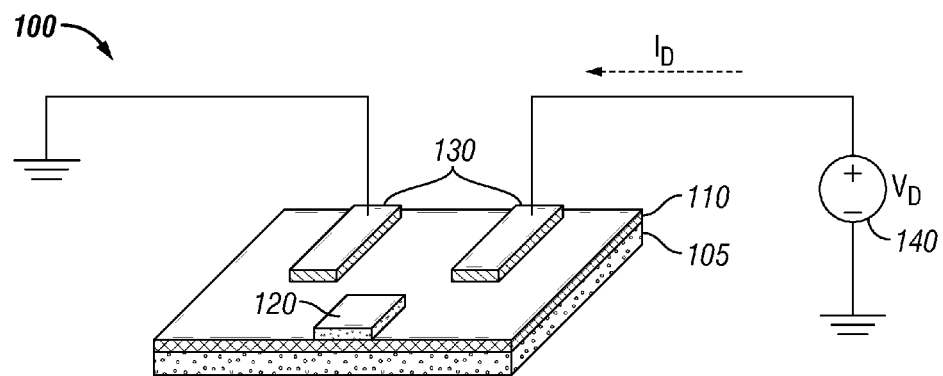
FIG. 1 shows an embodiment of an exemplary chalcogenide glass radiation sensor.

FIG. 1 shows an embodiment of an exemplary radiation sensor 100 according to the current disclosure. This and other figures are not necessarily to scale. In the illustrated embodiment, the sensor 100 includes a chalcogenide glass layer 110 deposed on a substrate 105, wherein the substrate 105 may comprise an insulating substrate. In some cases, the substrate 105 may comprise a relatively flexible substrate. The sensor 100 further includes two electrodes 130 deposed on the chalcogenide glass layer 110 and a metal source 120 also deposed on the chalcogenide glass layer 110. In the illustrated embodiment, the electrodes 130 may both be inactive or any combination of active and inactive materials. In the illustrated embodiment, the electrodes 130 can comprise tungsten (W) and/or nickel (Ni). The metal source 120 can comprise relatively electronegative metals including, among other things, silver (Ag) and copper (Cu) atoms. The sensor 100 may be configured to be attached to a voltage source ($V_D$) 140 to sense the resistivity of the chalcogenide glass layer 110.

In one embodiment, the chalcogenide glass layer 110 comprises $Ge_{30}Se_{70}$. As shown in FIG. 7, when the $Ge_{30}Se_{70}$ chalcogenide glass layer 110 and metal source 120 are exposed to 200 krad of gamma rays and the conductivity is measured both before and after exposure to ionizing radiation, the result is significant differences in the resistivity of the chalcogenide glass layer 110. Before radiation, the $Ge_{30}Se_{70}$ layer exhibits a fairly stable current response around 10 pA as the applied voltage approaches 1 V. After radiation, the $Ge_{30}Se_{70}$ layer exhibits an exponential response approaching 10 mA as the applied voltage approaches 1 V. The resistivity response can be explained by the unique electronic and atomic structures and, the lack crystallographic periodicity of chalcogenide glasses, and the introduction, via diffusion, of metallic atoms, such as for instance, Ag and Cu atoms. Electrically, these glasses are semiconductors with energy gaps of about 1 to 3 eV and a plurality of states in the band gap region due to chalcogenide glass lone-pair electrons that can be excited by a wide range of wavelengths including gamma rays. Therefore, chalcogenide glass-based devices may be configured to function as radiation sensors.

Structurally, chalcogenide glasses have moderate atomic connectivity. Therefore, it is possible to vary the composition of the glass to achieve very floppy (Z<2.4), non-stressed (2.4≦Z<2.5), and stressed rigid atomic structure (Z≧2.5). Thus, it may be possible to configure the chalcogenide glass sensor to exhibit a greater variety of radiation-induced effects. Keeping in mind the desire of forming a compound of a predetermined structural density to facilitate metal diffusion, the main coordination number (Z) of the glasses may be determined as follows:

$$Z = 1/N \sum_{r=1} rN_r$$

and $$N = \sum_{r=1} N_r.$$

where $N_r$ is the total number of atoms with r bonds. In performing the calculations, it is assumed that the compositions follow the 8-N rule, which generally governs covalently bonded materials.

Silver (Ag) is one metal of interest, however, it is to be understood that sensors comprising a variety of metals and metallic alloys are also fully encompassed in the present application. For instance, copper (Cu) is another metal that may be used to achieve a sensor 100 with radiation sensitive characteristics. Ag has comparatively high electron mobility, forms color centers in glasses, and has a rate of diffusion that can be accelerated by exposure to ionizing radiation. Indeed, an $Ag^+$ content as small as a few ppm can significantly increase the conductivity of the ChG material into which Ag is introduced.

In operation, the radiation sensor 100 may be exposed to ionizing radiation. Exposure to ionizing radiation causes metal atoms from the metal source 120 to diffuse into the chalcogenide glass layer 110. As discussed above, the diffusion of metal atoms into the chalcogenide glass layer 110 can lead to different electrical and optical properties of the chalcogenide glass layer 110. For instance, the diffusion of Ag atoms from the metal source 120 can lead to an increased conductivity in the chalcogenide glass layer 110. Prior to irradiation, the chalcogenide glass layer 110 can exhibit a relatively low conductivity. The sensor 100 can be configured to be highly sensitive to ionizing radiation such that a relatively small dosage of ionizing radiation can cause a significant increase in conductivity of the chalcogenide glass layer 110. In other embodiments, doping the chalcogenide glass 110 with antimony (Sb) can yield a sensor 100 of reduced sensitivity to ionizing radiation, yet increase the possible dose sensitivity range to more than 10 MGy. A voltage source 140 may be configured to facilitate the measurement of any changes of resistivity of the chalcogenide glass layer 110 due to irradiation. According to these embodiments, a current $I_D$ can be transmitted across the electrodes 130 and a voltage drop may be measured across the electrodes 130. In some cases, the voltage drop may be measured as a function of time in order to convey sensed ionizing radiation as a dose.

Furthermore, according to some embodiments, the sensor 100 may be returned to its initial condition by applying a DC current between electrodes 130, which may be positively biased, and the metal source 120, which may be negatively biased. According to these embodiments, the applied current may cause reverse metal diffusion, thus configuring the sensor 100 to be reversible.

Figure 2:
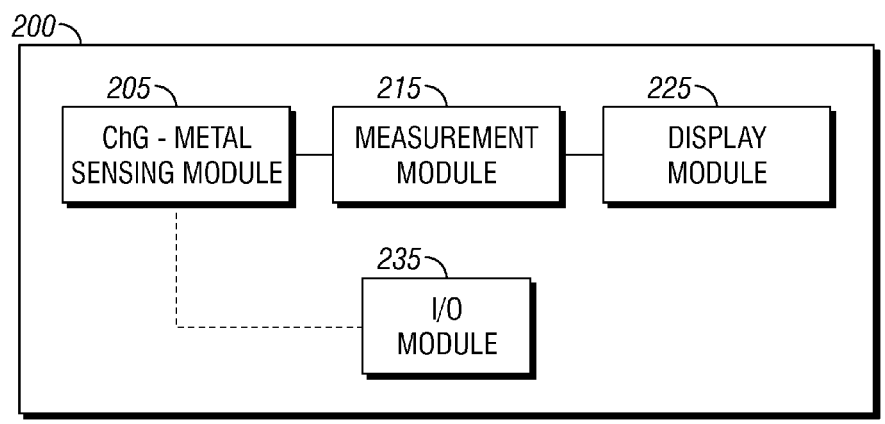
FIG. 2 is a block diagram representing one possible embodiment of a radiation sensor.

FIG. 2 is a block diagram that illustrates one embodiment of a ChG-metal radiation sensor 200. According to this embodiment, the ChG-metal radiation sensor 200 comprises a measurement module 215 coupled to a ChG-metal sensing module 205, a display module 225, and an I/O module 235. Optionally, the ChG-metal sensing module 205 may be coupled directly to the I/O module 235. As understood by those of ordinary skill in the art, the coupling of different modules of the ChG-metal radiation sensor 200 and ordering of that coupling may change to achieve the objectives of the present application.

In some embodiments, the ChG-metal sensing module 205 may comprise a ChG-Ag-based sensor. In operation, the ChG-metal sensing module 205 may be configured to "sense" exposure to gamma radiation, among other things, as a measure of a change in resistivity of the ChG-metal sensing module 205. According to some embodiments, the ChG-metal sensing module 205 may be configured to transmit a signal comprising a ChG layer resistivity value to the measurement module 215. The measurement module 215 can use the resistivity value to calculate a value corresponding to a gamma ray exposure. According to an embodiment, the measurement module 215 can transmit the gamma ray exposure value to a display module 225 in order to display the gamma ray exposure value. In some embodiments, the display module 225 can transmit the gamma ray exposure value to a suitable display device, such as an LCD screen or an analog display.

The measurement module 215 can transmit the gamma ray exposure value to an I/O module 235, wherein the I/O module 235 can transmit the gamma ray exposure value through an output port, such as a wired port or a wireless transmission port. In some embodiments, the I/O module 235 facilitates the wireless transmission of a gamma ray exposure value to a remote location to facilitate low-risk radioactive exposure evaluation, among other things. As used herein, a remote location comprises an off-site location, or an on-site location configured to be protected from ionizing radiation exposure. According to an embodiment, the ChG-metal sensing module 205 can be configured to transmit a ChG layer resistivity value directly to an I/O module 235 for remote calculation.

FIGS. 3A-3D are profile views of a chalcogenide glass-metal radiation sensor at different steps of one possible fabrication process. According to one embodiment, a chalcogenide glass-metal radiation sensor 300 comprises a chalcogenide film 310 deposited on an insulating substrate layer 305. According to one embodiment, electrodes 330, which may be inactive electrodes, may be created by depositing a metal layer 330 on the chalcogenide glass layer 310, as shown in FIG. 3B, and etching away a portion of the metal layer 330, as shown in FIG. 3C. Alternatively, the electrodes 330 may be fabricated by any other appropriate method or procedure. A metal source layer (not shown) may be deposited on the electrodes 330 and the chalcogenide film 310 and etched away to leave metal source 320, as shown in FIG. 3D. Alternatively, the metal source 320 may be deposited according to any other appropriate method.

Those of ordinary skill in the art will recognize that other possible embodiments may exist. For instance, FIG. 8 shows another possible embodiment of a chalcogenide glass-metal radiation sensor 800. The ChG-metal sensor 800 comprises an insulating substrate 805 coupled to a metal source 820, a chalcogenide glass layer 810 deposited on the metal source 820, and electrodes 830 deposited on the chalcogenide glass layer 810. It is to be understood that a ChG-metal sensor 800 operates and may be fabricated according to the same principles and practices discussed above.

FIGS. 4A and 4B show profile views of one embodiment of a ChG-metal sensor during irradiation, as shown in FIG. 4A, and after irradiation, as shown in FIG. 4B. According to one possible embodiment, a ChG-metal sensor 400 may comprise a ChG layer 410 deposited on a substrate 405. The ChG-metal sensor 400 may also comprise electrodes 430. According to some embodiments, the electrodes 430 may be inactive. According to some embodiments, the electrodes 430 can be configured to form a galvanic element. According to some embodiments, the electrodes 430 may comprise W and/or Ni. The ChG-metal sensor 400 may comprise a metal source 420. In some embodiments, the metal source 420 comprises Ag.

In operation, when the ChG-metal sensor 400 is exposed to ionizing radiation 450, metal atoms from the metal source 420 diffuse into the ChG layer 410, as shown in FIG. 4B by the introduction of dots (metal atoms) into the ChG layer 410. In these embodiments, the ChG layer 410 with diffused metal atoms has an altered conductivity, and the conductivity of the ChG layer 410 can be measured to determine the dose of radiation absorbed by the ChG-metal sensor 400.

Figure 5A:
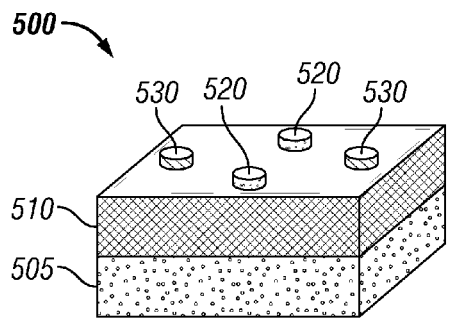
FIGS. 5A and 5B are views of two embodiments of a radiation sensor.
Figure 5B:
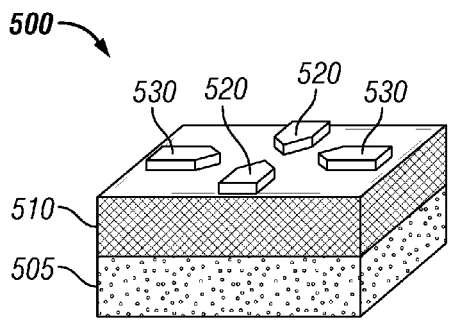

FIG. 5A illustrates a perspective view of one embodiment of a ChG-metal radiation sensor 500. In the illustrated embodiment, the ChG-metal radiation sensor 500 comprises a ChG layer 510 deposited on a substrate 505. Two electrodes 530 are deposited on the ChG layer 510. Two metal source regions 520 are also deposited on the ChG layer 510. Of course, different metal source numbers, shapes, and arrangements are possible and contemplated under the present application. For instance, as shown in FIG. 5A, the metal source regions 520 may comprise circular surfaces. Alternatively, as shown in FIG. 5B, the metal source regions 520 may comprise pentagonal surfaces. In some embodiments, the metal source regions 520 comprise Ag or Cu atoms.

In operation, when exposed to ionizing radiation, as described above, metal atoms from the metal source dots 520 diffuse into the ChG layer 510 and thus alter the resistivity of the ChG layer 510. In some embodiments, the resistivity of the ChG layer 510 may be sensed by pulsing a relatively low bias current between the electrodes 530. In some embodiments, a relatively low bias current is a current that does not induce a change in the crystalline state of the ChG. As current travels between the electrodes 530, an electric field may form relative to the path of current flow between the electrodes 530. Those skilled in the art will appreciate the benefit of selecting the shape and positioning of the metal source regions 520 and/or electrodes 530 so as to facilitate the diffusion of metal atoms while avoiding exposing the metal source regions 520 to the electric field that may form relative to the electrodes 530. For instance, electrodes 530 with elongated interior ends, as demonstrated by the pentagonal surfaces in FIG. 5B, may lead to a narrower electric field. In some embodiments, the resistivity of the ChG layer 510 may be used to calculate a gamma ray dosage and/or intensity value.

Optical radiation sensors function based on changes to the optical characteristics of the underlying material upon exposure to ionizing radiation. As discussed above, the introduction of Ag into chalcogenide glasses can lead to the formation of color centers. Therefore, a radiation sensor according to the present application comprising Ag and a chalcogenide glass can form a radiation sensor that may be configured to be read based not only on the electrical changes that occur in response to exposure to ionizing radiation, but also according to changes in optical properties based on irradiation. Furthermore, while traditional thermoluminescent radiation sensors require high temperatures to return the sensor to its initial state, a ChG-Ag radiation sensor may be returned to its initial state at relatively lower temperatures, such as temperatures less than about 500K.

Figure 6:
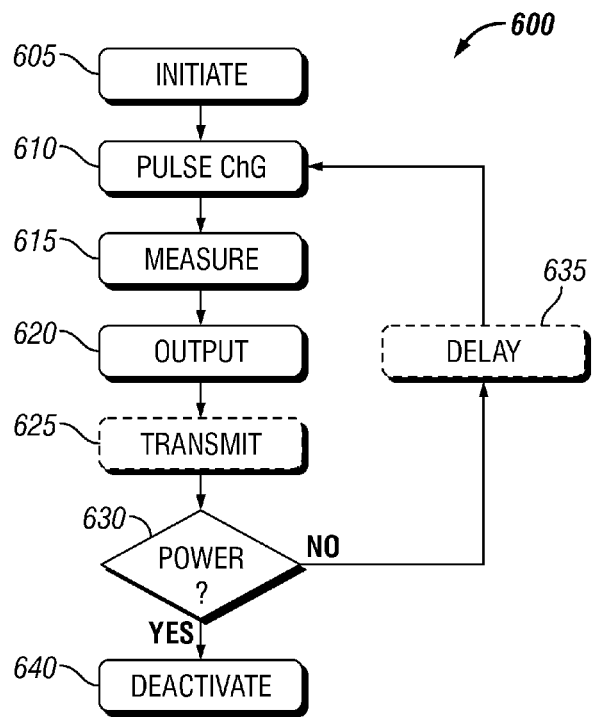
FIG. 6 is a flow chart of one method embodiment illustrating sensing ionizing radiation.

FIG. 6 illustrates a method 600 of using a ChG-metal dosimeter, such as the radiation sensor 100 illustrated in FIG. 1, to sense ionizing radiation exposure. In a first method step 605, the supporting circuitry of the sensor 100, such as, for example, voltage source $V_D$ 140, is initiated. In a next method step 610, current is pulsed through the ChG layer 110 in order to determine a resistivity value of the ChG layer 110. In some cases, the current pulse might represent, among other things, a relatively constant DC current. In a next method step 615, the resistivity value of the ChG layer 110 is measured based on the current pulsed in step 610.

In a next method step 620, the measured resistivity of the ChG layer 110 is output. In some cases, the measured resistivity can be output to a different module, such as a measurement module 215, as shown in FIG. 2, of the ChG-metal radiation sensor 100. In yet other embodiments, the measured resistivity can be output to a display module (see e.g., 225). In an optional method step 625, the measured resistivity can be transmitted to a remote location via a suitable wireless or wired connection, such as over copper-based wires or fiber optic-based wires, among other things.

In a next method step 630, the ChG-metal radiation sensor 100 is configured to sense whether or not an instruction has been transmitted to power down or enter a power-saving mode. In some embodiments, the instruction can be transmitted by pressing a button or flipping a switch, among other things. If there is no instruction to power down, then the method 600 loops back through steps 610-630, as indicated in FIG. 6. If there is a power-down instruction at 630, the ChG-metal radiation sensor 100 deactivates at the method step 640. The method 600 also includes an optional method delay step 635, according to which, a predetermined or user-controlled delay may be inserted into the method loop 600 prior to looping back to the pulsing step 610. The introduction of a delay may be beneficial for the reduction of power consumption, among other things.

FIG. 7 illustrates the resistivity response of a ChG-metal radiation sensor 100 exposed to 200 krad of ionizing radiation. As discussed above, before radiation, the ChG layer 110 exhibits a relatively stable current response. However, after radiation, the introduction of Ag atoms from the metal source 120 causes an exponential current response in the ChG layer 110.

As discussed above, FIG. 8 shows another possible embodiment of a chalcogenide glass-metal radiation sensor 800. The ChG-metal sensor 800 comprises an insulating substrate 805 coupled to a metal source 820, a chalcogenide glass layer 810 deposited on the metal source 820, and electrodes 830 deposited on the chalcogenide glass layer 810. It is to be understood that a ChG-metal sensor 800 operates and may be fabricated according to the same principles and practices discussed above.

FIG. 9 illustrates the operation of electrical fields when attempting to determine the resistivity of a chalcogenide glass layer 910 of a chalcogenide glass-metal sensor 900. FIG. 9 shows two electrodes 930 and two metal sources 920 deposited on a chalcogenide glass layer 910. By way of illustration, FIG. 9 also uses broken lines to demonstrate the presence of an electric field between the two electrodes 930.

In operation, as current flows between the electrodes 930, an electric field is created, as illustrated by the broken lines between the electrodes 930. As discussed above, those skilled in the art will appreciate the importance of positioning metal sources 920 external to the electric field, and on the other hand, the importance that metal sources 920 be positioned in relative proximity to the flow of current.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims and equivalents thereof.

What is claimed is:

1. A chalcogenide glass radiation sensor comprising:
a chalcogenide glass layer having a resistivity;
at least two electrodes electrically coupled to the chalcogenide glass layer, wherein the at least two electrodes are configured to facilitate the measurement of the resistivity of the chalcogenide glass layer; and
a metal source coupled to the chalcogenide glass layer such that the resistivity of the chalcogenide glass layer changes upon exposure to ionizing radiation,
wherein the metal source is configured to be positioned external to an electric field that may form between the at least two electrodes as the resistivity of the chalcogenide glass layer is measured.

2. The chalcogenide glass radiation sensor of claim 1 wherein the chalcogenide glass layer comprises at least one of Ge—S and Ge—Se.

3. The chalcogenide glass radiation sensor of claim 2 wherein the chalcogenide glass layer further comprises Sb atoms.

4. The chalcogenide glass radiation sensor of claim 1 wherein the metal source comprises a plurality of distinct metal regions, and the plurality of distinct metal regions comprise at least one of Ag and/or Cu.

5. The chalcogenide glass radiation sensor of claim 1 wherein the metal source comprises a pentagonal surface.

6. The chalcogenide glass radiation sensor of claim 1 wherein the at least two electrodes are configured to form a galvanic element.

7. The chalcogenide glass radiation sensor of claim 1 further comprising a substrate connected to at least one of the chalcogenide glass layer and the metal source, and wherein the substrate is relatively flexible.

8. A method of measuring ionizing radiation with a chalcogenide glass radiation sensor comprising a metal source coupled to a chalcogenide glass layer, the chalcogenide glass layer having a resistivity that changes as a function of exposure to ionizing radiation, the method comprising:
exposing the chalcogenide glass radiation sensor to ionizing radiation, thereby causing diffusion of atoms from the metal source into the chalcogenide glass layer; and
measuring the resistivity of the chalcogenide glass layer to determine the intensity of radiation to which the chalcogenide glass radiation sensor is exposed.

9. The method of claim 8 wherein measuring the resistivity of the chalcogenide glass layer further comprises:
pulsing a current across at least two electrodes electrically connected to the chalcogenide glass layer; and determining the resistivity of the chalcogenide glass layer based on a voltage drop across the at least two electrodes.

10. The method of claim 8 further comprising transmitting the resistivity of the chalcogenide glass layer to a display module.

11. The method of claim 8 further comprising transmitting the resistivity of the chalcogenide glass layer via a wired or wireless connection to a remote location.

12. The method of claim 8 further comprising measuring an initial resistivity of the chalcogenide glass layer.

13. The method of claim 12 further comprising measuring at least a first and a second resistivity of the chalcogenide glass layer, the first resistivity and second resistivity being measured at a predetermined first time and second time, respectively, after measuring the initial resistivity.

14. The method of claim 8 wherein measuring the intensity of radiation comprises measuring the resistivity of the chalcogenide glass layer as a function of time.

15. The method of claim 8 further comprising reversing the diffusion of atoms from the metal source back to the metal source.

16. A chalcogenide glass radiation sensor comprising:
a chalcogenide glass radiation sensing module comprising:
  a chalcogenide glass layer having a resistivity;
  at least two electrodes electrically coupled to the chalcogenide glass layer, wherein the at least two electrodes are configured to facilitate the measurement of the resistivity of the chalcogenide glass layer; and
  a metal source coupled to the chalcogenide glass layer such that the resistivity of the chalcogenide glass layer changes upon exposure to ionizing radiation,
  wherein the metal source is configured to be positioned external to an electric field that may form between the at least two electrodes as the resistivity of the chalcogenide glass layer is measured;
a measurement module coupled to the chalcogenide glass radiation sensing module and configured to measure a resistivity of the chalcogenide glass layer; and
a display module coupled to the chalcogenide glass radiation sensing module and the measurement module, and configured to display a measured resistivity.

17. The radiation sensor of claim 16 wherein the metal source comprises a plurality of distinct metal regions.

18. The radiation sensor of claim 16 wherein the metal source comprises a pentagonal surface.

19. The radiation sensor of claim 16 wherein the metal source comprises at least one of Ag or Cu.

20. The radiation sensor of claim 16 wherein the at least two electrodes comprise at least one of Ni and W.

* * * * *

UNITED STATES PATENT AND TRADEMARK OFFICE
CERTIFICATE OF CORRECTION

PATENT NO. : 8,466,425 B2  
APPLICATION NO. : 13/249106  
DATED : June 18, 2013  
INVENTOR(S) : Maria Mitkova et al.

Page 1 of 1

It is certified that error appears in the above-identified patent and that said Letters Patent is hereby corrected as shown below:

In the Specification

Col. 1 before Background insert

--STATEMENT REGARDING FEDERALLY SPONSORED RESEARCH

This invention was made with government support under Contract No. DE-AC07-05ID14517 awarded by the Department of Energy. The Government has certain rights in this invention.--

Signed and Sealed this
Twenty-seventh Day of May, 2014

Michelle K. Lee
*Deputy Director of the United States Patent and Trademark Office*